(12) United States Patent
Smith et al.

(10) Patent No.: US 11,018,077 B2
(45) Date of Patent: May 25, 2021

(54) MODULAR MICROJET COOLING OF PACKAGED ELECTRONIC COMPONENTS

(71) Applicant: Massachusetts Institute Of Technology, Cambridge, MA (US)

(72) Inventors: James Paul Smith, Chelmsford, MA (US); Bernard A. Malouin, Jr., Westford, MA (US); Eric A. Browne, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/844,446

(22) Filed: Apr. 9, 2020

(65) Prior Publication Data

US 2020/0312746 A1   Oct. 1, 2020

Related U.S. Application Data

(63) Continuation of application No. 16/039,492, filed on Jul. 19, 2018, now Pat. No. 10,665,529.

(60) Provisional application No. 62/535,339, filed on Jul. 21, 2017.

(51) Int. Cl.
   *H01L 23/473* (2006.01)
   *H01L 23/13* (2006.01)
   *H05K 7/20* (2006.01)

(52) U.S. Cl.
   CPC .......... *H01L 23/4735* (2013.01); *H01L 23/13* (2013.01); *H05K 7/20927* (2013.01)

(58) Field of Classification Search
   CPC ....... H01L 23/473; H01L 23/467; G06F 1/20; H05K 7/20927; H05K 7/20763; H05K 7/20254; H05K 1/0203
   See application file for complete search history.

(56) References Cited

U.S. PATENT DOCUMENTS

| | | | |
|---|---|---|---|
| 5,021,924 A | 6/1991 | Kieda et al. | |
| 5,264,984 A | 11/1993 | Akamatsu | |
| 5,349,831 A | 9/1994 | Daikoku et al. | |
| 5,353,865 A | 10/1994 | Adiutori et al. | |
| 5,768,103 A | 6/1998 | Kobrinetz et al. | |
| 6,105,373 A * | 8/2000 | Watanabe | H01L 35/30 62/3.7 |
| 6,650,542 B1 | 11/2003 | Chrysler et al. | |

(Continued)

OTHER PUBLICATIONS

International Search Report and Written Opinion dated Jan. 5, 2018 in co-pending PCT application No. PCT/US2017/059030.

(Continued)

*Primary Examiner* — Adam B Dravininkas
(74) *Attorney, Agent, or Firm* — Nields, Lemack & Frame, LLC

(57) ABSTRACT

The present invention generally relates to a modular microjet cooler. The modular microjet cooler may be attached to a packaged heat generating device that is mounted on a printed circuit board. The modular microjet cooler has an inlet allowing supply fluid to be directed through microjet nozzles toward an impingement surface on the packaged device. The modular microjet cooler also has one or more outlets that allow exhaust fluid to be removed. The modular microjet cooler is attached to the device after it has been packaged. Further, the modular microjet cooler may be attached to the packaged device either before or after it is mounted to the printed circuit board.

7 Claims, 9 Drawing Sheets

(56) References Cited

U.S. PATENT DOCUMENTS

| | | | |
|---|---|---|---|
| 7,511,957 B2 * | 3/2009 | Campbell | F28C 3/08 |
| | | | 165/80.4 |
| 7,557,002 B2 | 7/2009 | Wells et al. | |
| 7,731,079 B2 | 6/2010 | Campbell et al. | |
| 7,956,416 B2 | 6/2011 | Wells et al. | |
| 7,978,473 B2 | 7/2011 | Campbell et al. | |
| 7,992,627 B2 | 8/2011 | Bezama et al. | |
| 8,426,919 B2 | 4/2013 | Wells et al. | |
| 8,485,147 B2 | 7/2013 | Liu et al. | |
| 8,643,173 B1 * | 2/2014 | Rau | H05K 7/2029 |
| | | | 257/714 |
| 8,659,896 B2 | 2/2014 | Dede et al. | |
| 8,786,078 B1 | 7/2014 | Rau et al. | |
| 8,912,643 B2 | 12/2014 | de Bock et al. | |
| 8,944,151 B2 | 2/2015 | Flotta et al. | |
| 9,099,295 B2 * | 8/2015 | Kuhlmann | H01L 23/00 |
| 9,131,631 B2 | 9/2015 | Joshi | |
| 9,165,857 B2 * | 10/2015 | Song | H05K 7/2039 |
| 9,252,069 B2 | 2/2016 | Bhunia et al. | |
| 9,341,104 B2 | 5/2016 | Liu et al. | |
| 9,445,526 B2 | 9/2016 | Zhou et al. | |
| 9,484,284 B1 | 11/2016 | Gambin et al. | |
| 9,622,380 B1 | 4/2017 | Joshi et al. | |
| 9,980,415 B2 | 5/2018 | Zhou et al. | |
| 10,306,802 B1 | 5/2019 | Ditri et al. | |
| 10,651,112 B2 | 5/2020 | Malouin et al. | |
| 10,665,529 B2 | 5/2020 | Smith et al. | |
| 2004/0141034 A1 | 7/2004 | Usui et al. | |
| 2005/0183844 A1 | 8/2005 | Tilton et al. | |
| 2006/0207746 A1 | 9/2006 | Bhatti et al. | |
| 2006/0250774 A1 * | 11/2006 | Campbell | H01L 23/4735 |
| | | | 361/699 |
| 2007/0272392 A1 * | 11/2007 | Ghosh | H01L 23/4336 |
| | | | 165/80.4 |
| 2007/0274045 A1 * | 11/2007 | Campbell | F28F 7/00 |
| | | | 361/699 |
| 2008/0037221 A1 * | 2/2008 | Campbell | H01L 23/4735 |
| | | | 361/699 |
| 2009/0095444 A1 | 4/2009 | Bezama et al. | |
| 2009/0288807 A1 | 11/2009 | Yang et al. | |
| 2010/0328882 A1 | 12/2010 | Campbell et al. | |
| 2011/0210400 A1 | 9/2011 | Wells et al. | |
| 2012/0113191 A1 | 5/2012 | Silverbrook | |
| 2012/0170222 A1 | 7/2012 | Dede et al. | |
| 2012/0205071 A1 | 8/2012 | Yang et al. | |
| 2012/0212907 A1 | 8/2012 | Dede | |
| 2013/0027878 A1 | 1/2013 | Campbell et al. | |
| 2013/0027883 A1 * | 1/2013 | Campbell | H05K 7/20318 |
| | | | 361/700 |
| 2013/0027884 A1 | 1/2013 | Campbell et al. | |
| 2013/0032311 A1 | 2/2013 | Bhunia et al. | |
| 2014/0190665 A1 | 7/2014 | Joshi et al. | |
| 2014/0204532 A1 * | 7/2014 | Mehring | H05K 7/20345 |
| | | | 361/689 |
| 2014/0284787 A1 | 9/2014 | Joshi | |
| 2015/0043164 A1 * | 2/2015 | Joshi | H01L 23/4735 |
| | | | 361/699 |
| 2015/0348869 A1 * | 12/2015 | Joshi | H01L 25/07 |
| | | | 361/700 |
| 2016/0007499 A1 * | 1/2016 | Song | H05K 7/20272 |
| | | | 165/185 |
| 2016/0123637 A1 | 5/2016 | Moreno et al. | |
| 2016/0183409 A1 * | 6/2016 | Zhou | H01L 23/4735 |
| | | | 361/699 |
| 2016/0240419 A1 | 8/2016 | Sieber et al. | |
| 2016/0369740 A1 | 12/2016 | MacKenzie | |
| 2017/0092565 A1 | 3/2017 | Chen et al. | |
| 2017/0094837 A1 | 3/2017 | Joshi et al. | |
| 2017/0105313 A1 | 4/2017 | Shedd et al. | |
| 2017/0122476 A1 | 5/2017 | Diaz et al. | |
| 2018/0031330 A1 | 2/2018 | Roberts et al. | |
| 2018/0145010 A1 | 5/2018 | Fukuoka et al. | |
| 2018/0160565 A1 | 6/2018 | Parida | |
| 2018/0166359 A1 | 6/2018 | Fukuoka | |
| 2019/0013258 A1 | 1/2019 | Malouin et al. | |
| 2020/0027819 A1 | 1/2020 | Smith et al. | |
| 2020/0168526 A1 | 5/2020 | Malouin et al. | |

OTHER PUBLICATIONS

International Search Report and Written Opinion dated Sep. 27, 2018 in corresponding PCT application No. PCT/US2018/042809.

Browne et al., "Experimental Investigation of Single-Phase Microjet Array Heat Transfer", J. Heat Transfer, vol. 132, Apr. 2010.

Notice of allowance dated Sep. 30, 2020 in co-pending U.S. Appl. No. 16/712,316.

* cited by examiner

FLUID STREAMLINES

HEAT TRANSFER COEFFECIENT ON IMPINGEMENT SURFACE

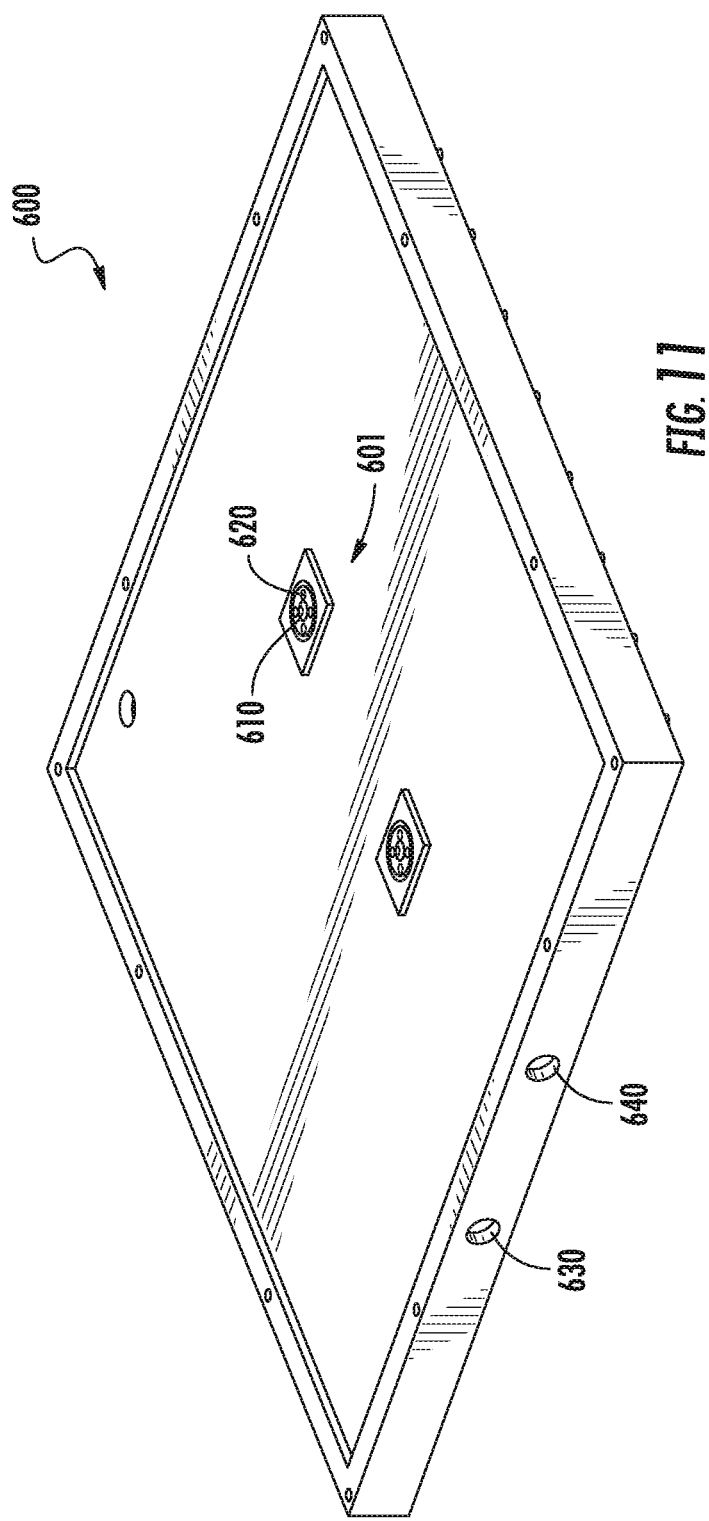

MODULAR MICROJET COOLING OF PACKAGED ELECTRONIC COMPONENTS

This application is a continuation of U.S. patent application Ser. No. 16/039,492 filed Jul. 19, 2018, which claims priority to U.S. Provisional Patent Application Ser. No. 62/535,339, filed Jul. 21, 2017, the disclosures of which are incorporated herein by reference in its entireties.

This invention was made with Government support under Contract No. FA8721-05-C-0002 awarded by the United States Air Force. The Government has certain rights in the invention.

BACKGROUND OF THE INVENTION

Many electronic components, such as processing units, and radio frequency (RF) devices, are commonly used in many of today's circuits and generate significant amounts of heat. For example, RF devices, such as high electron mobility transistors (HEMTs), are commonly used in radar (aircraft surveillance, weather surveillance, tactical); electronic warfare (EW), including jamming; RF communication systems; and other applications. Processing units, such as CPUs, are commonly used in computers, laptops, mobile electronics, and other applications.

A limiting factor in many of these applications is the maximum component temperature of the heat generating device, which may occur, for example, within the gate region of a HEMT. Component lifetime is a function of maximum temperature, and as such, a trade-off is often made between lifetime, maximum power output, and/or duty cycle.

The maximum component temperature in these heat generating devices is governed by heat transfer at several layers.

First, the conductive thermal resistance through the heat generating component itself is a factor in determining the maximum component temperature. The electrically active region of a heat generating device is typically located on one side of a semiconductor substrate, which may be, for example, silicon, gallium nitride, or gallium arsenide. This is the region where waste heat is generated. This heat must be conducted through the substrate before being dissipated through the thermal management system. Thermal resistance scales with thickness.

Second, the heat transfer from the surface of the semiconductor substrate to the thermal management system is a factor in determining the maximum component temperature. Thermal management systems usually conduct heat from the heat generating device into a spreader or heat sink. These systems then dissipate the heat to the ambient environment, such as via free convection, conduction, or radiation, or to a coolant, using forced convection.

Existing technologies use finned heat sinks, cold plates, microchannels, or radiators for this purpose. Thus, the heat transfer from the heat generating device can be limited by the performance of these technologies. For example, these technologies usually rely on the presence of a thermal interface material (TIM) between the component and the thermal management system. The thermal interface material, even if chosen to have low resistance, still reduces the efficiency of any solution.

Further, the size, weight, and power (SWaP) of existing thermal management solutions often drives the design of these systems and can limit their performance. For example, the system in which the heat generating device is contained may be compact, limiting the ability to transfer the heat to a cooler ambient location.

Therefore, it would be beneficial if there were a thermal management system that addressed these challenges by minimizing the conductive and convective thermal resistance in heat generating devices and reducing or eliminating the dependence on SWaP-constraining heat sinks, spreaders, and similar devices.

SUMMARY OF THE INVENTION

The present invention generally relates to a modular microjet cooler. The modular microjet cooler may be attached to a packaged heat generating device that is mounted on a printed circuit board. The modular microjet cooler has an inlet allowing supply fluid to be directed through microjet nozzles toward an impingement surface on the device package. The modular microjet cooler also has one or more outlets that allow exhaust fluid to be removed. The modular microjet cooler is attached to the device after it has been fabricated and packaged. Further, the modular microjet cooler may be attached to the packaged device either before or after it is mounted to the printed circuit board.

According to one embodiment, a modular microjet cooler is disclosed. The modular microjet cooler comprises a base having a plurality of microjet nozzles and an exit port; raised sidewalls extending from the base, defining a cavity having an open side opposite the base; an attachment mechanism disposed on ends of the raised sidewalls; an inlet tube in communication with the plurality of microjet nozzles; and an outlet tube in communication with the exit port. In some embodiments, the base comprises a center portion, where the plurality of microjet nozzles are disposed, and a trench surrounding the center portion, wherein the exit port is disposed in the trench. In certain embodiments, the inlet tube and the outlet tube are attached to the base on an exterior surface opposite the cavity. In certain embodiments, the attachment mechanism comprises solder, an adhesive or a gasket.

According to a further embodiment, an assembly is disclosed. The assembly comprises the modular microjet cooler described above and a packaged heat generating device, wherein the ends of the raised sidewalls are attached to an impingement surface of the packaged heat generating device, using the attachment mechanism, forming a fluid-tight connection. In some embodiments, the packaged heat generating device is mounted to a printed circuit board.

According to another embodiment, a modular microjet cooler is disclosed. The modular microjet cooler comprises a base having a plurality of microjet nozzles and an exit port; raised sidewalls extending from the base, defining a cavity having an open side opposite the base; an attachment mechanism disposed on ends of the raised sidewalls; an inlet connector disposed on a bottom surface of the base opposite the cavity, the inlet connector having a passage in communication with the plurality of microjet nozzles; and an output connector disposed on a bottom surface of the base opposite the cavity, the output connector having a passage in communication with the exit port. In certain embodiments, the inlet connector and the output connector are barbed fittings. In other embodiments, the inlet connector and the output connector are quick disconnect fittings. In certain embodiments, the base comprises a first portion, where the plurality of microjet nozzles are disposed, and a second portion adjacent to the first, wherein the exit port is disposed in the second portion.

According to a further embodiment, an assembly is disclosed. The assembly comprises the modular microjet cooler described above and a packaged heat generating device, wherein the ends of the sidewalls are attached to an impingement surface of the packaged heat generating device, using the attachment mechanism, forming a fluid-tight connection. In some embodiments, the packaged heat generating device is mounted to a printed circuit board.

According to another embodiment, an assembly is disclosed. The assembly comprises a modular microjet cooler, comprising a base having a plurality of microjet nozzles and an exit port; raised sidewalls extending from the base, defining a cavity having an open side; and an attachment mechanism disposed on ends of the raised sidewalls; a seal disposed on an exterior bottom surface of the base, where the seal surrounds at least one of the plurality of microjet nozzles; a second seal disposed on the exterior bottom surface of the base, where the second seal surrounds the exit port; and a manifold having a first opening in communication with the microjet nozzles for providing supply fluid to the microjet nozzles, and a second opening for accepting exhaust fluid from the exit port. In certain embodiments, the seal and the second seal provide a fluid-tight connection between the modular microjet cooler and the manifold. In some embodiments, the assembly further comprises a packaged heat generating device, wherein the ends of the raised sidewalls are attached to an impingement surface of the packaged heat generating device, using the attachment mechanism, forming a fluid-tight connection. In some embodiments, the attachment mechanism comprises solder, an adhesive or a gasket. In some embodiments, the packaged heat generating device is mounted to a printed circuit board.

BRIEF DESCRIPTION OF THE DRAWINGS

For a better understanding of the present disclosure, reference is made to the accompanying drawings, in which like elements are referenced with like numerals, and in which:

FIG. 11 shows a manifold that may be used with the embodiment of FIGS. 8A-8C and 9.

DETAILED DESCRIPTION

Microjet impingement is a heat transfer technique by which a jet or an array of jets impinge onto a surface for the purpose of transferring heat between the surface and the fluid of the jet. Jets can be formed by the use of nozzles, tubes or an orifice plate and are characterized by having a substantially higher momentum in one direction than the surrounding fluid. Typically, a turbulent jet exit velocity profile is flat across the radius, reducing to zero at the edge due to the presence of the nozzle. This high velocity jet suppresses the thermal boundary layer at the heat transfer surface resulting in high heat transfer coefficients.

In one possible implementation, an array of microjets exits a reservoir region through a micron-scale constriction in a jet plate at high velocities. The microjet is submerged (exiting the jet into a region containing coolant, rather than another fluid or a vacuum) and confined by geometry. The microjet is aimed at the impingement surface, where locally high fluid velocities, boundary layer suppression, and turbulent mixing produce extremely high convective heat transfer coefficients between the impingement surface and the coolant. Microjets can be arrayed geometrically to cool larger surface areas, with heat transfer coefficients of greater than 400 kW/m$^2$K averaged over a 1 mm$^2$ impingement surface, as indicated by computational fluid dynamics analyses of typical geometries. This may provide significant advantages over current advanced cold plate designs having performance on the order of 1 to 10 kW/m$^2$K.

Figure 1:
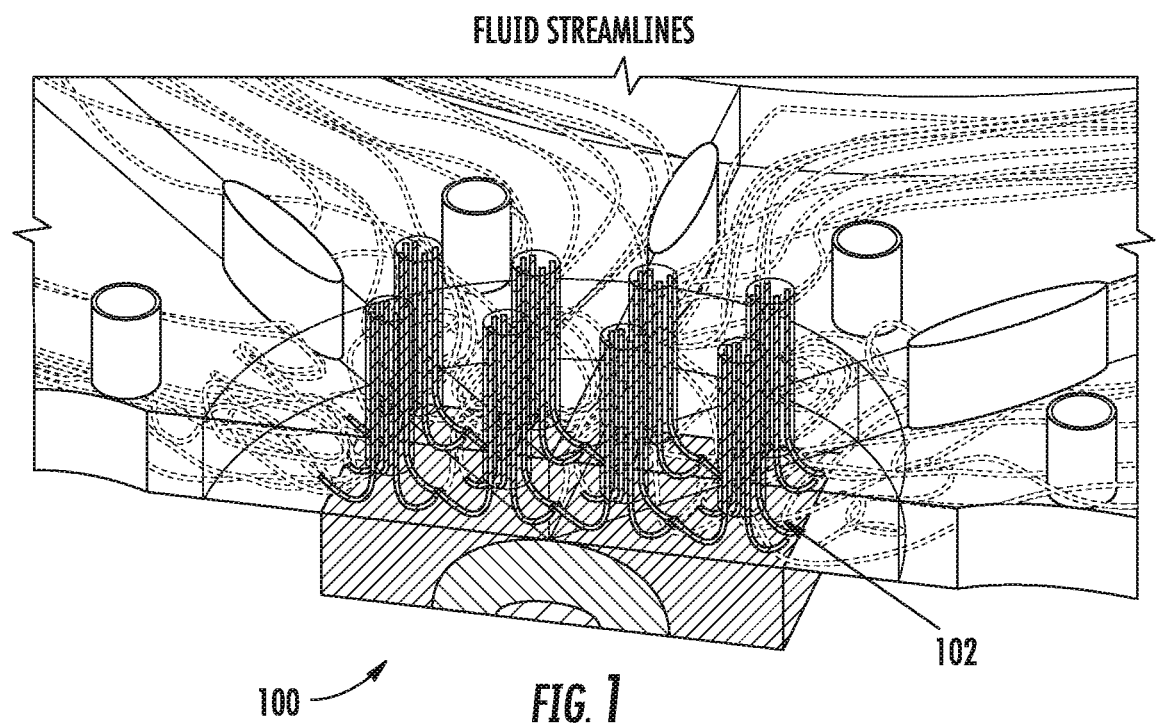
FIG. 1 shows the fluid streamlines predicted analytically for an array of microjets.

FIG. 1 shows fluid streamlines, as predicted analytically using computational fluid dynamics. These streamlines impinge upon the impingement surface 102 of the component 100. The coolant is heated and its velocity is turned and decreases. In this figure, the coolant exits through exhaust ports located outside of the array of microjets 220. Higher velocity streams are shown in solid lines, while lower velocity streams are shown in dotted lines.

Figure 2:
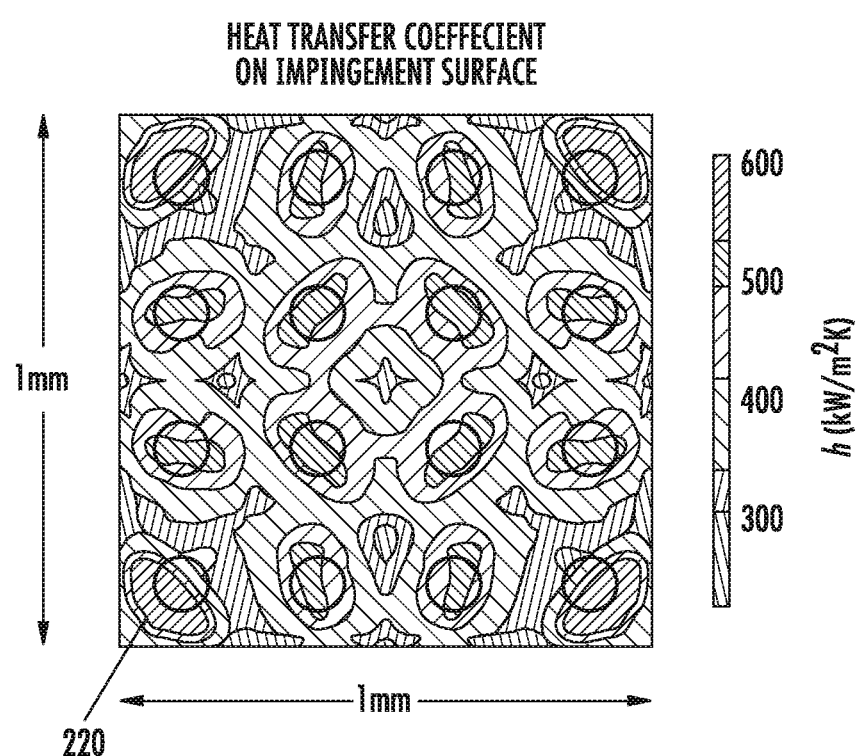
FIG. 2 shows the heat transfer coefficient on the impingement surface.

FIG. 2 shows the heat transfer coefficient on the impingement surface 102. In this figure, the microjets 220 are arranged as a 4×4 array spread over an area of 1 mm$^2$. Each microjet 220 has a diameter of 100 µm. In this example, the mean microjet velocity is 30 m/s. The heat transfer coefficient is as high as 600,000 W/m$^2$K. This heat transfer coefficient decreases moving away from the impingement zone.

Therefore, it would be advantageous to utilize microjet cooling as a heat transfer technique for heat generating components. The present disclosure introduces the concept of a modular microjet cooler. Unlike many existing high performance thermal management solutions, the modular microjet cooler brings very high thermal performance but does not have to be designed or integrated during device fabrication and packaging. Instead, a modular microjet cooler can be integrated directly onto a new or existing package, with the package exterior forming the impingement surface. Moreover, the direct impingement removes the need for any additional thermal interface materials (TIMs, e.g., thermal pastes) that are otherwise required for mechanical connection of finned heat sinks, traditional cold plates, or microchanneled attachments.

Electronic and other components are also encased in a package, which may be ceramic, plastic or another material. The electrical leads from the component typically terminate at pads, pins, or bumps on the outer surface of this package.

The type or configuration of the package that encases the heat generating device is not limited by this disclosure.

This integration could be accomplished by permanently bonding the modular microjet cooler to an exterior surface of the packaged electronic component, using, for example, adhesive or solder. Alternatively, this integration may be achieved by a temporary bond, such as using gaskets and a mechanical clamping force. By using modular microjet coolers, the often circuitous thermal paths between component packages and their ultimate heat sink are replaced with a single high performance, convective solution. In many instances, the use of a modular microjet cooler would require no modifications to the existing component fabrication process or package design.

Figure 3:
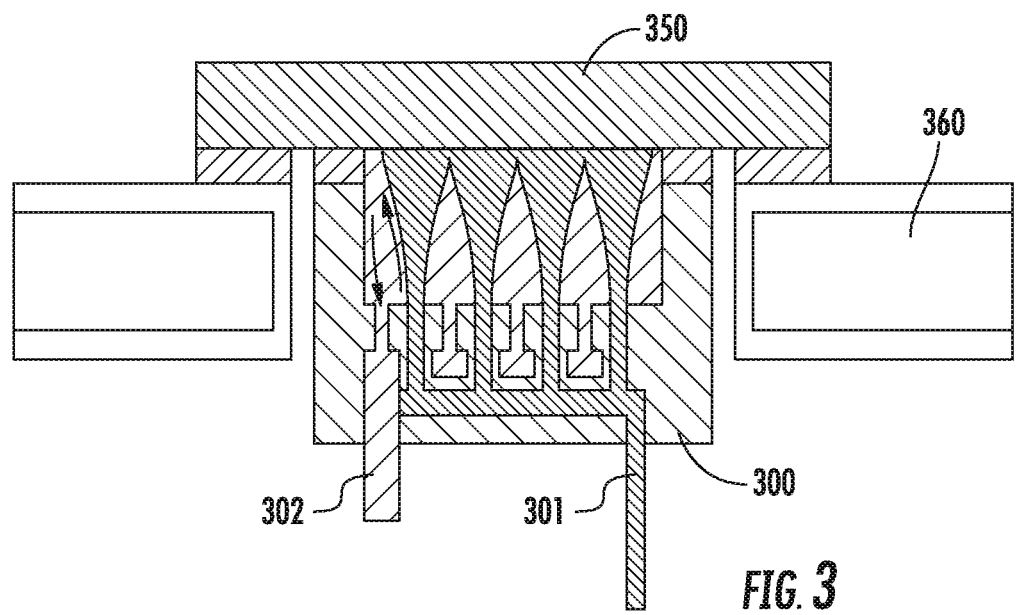
FIG. 3 illustrates the modular microjet cooler attached to a packaged heat generating device, according to one embodiment.

FIG. 3 shows a modular microjet cooler 300 soldered to a packaged heat generating device 350, which may be a gallium nitride (GaN) QFN package. The packaged heat generating device 350 is disposed on a conventional printed circuit board (PCB) 360. By using the exterior of the packaged heat generating device 350 as the impingement surface, higher heat transfer coefficients are achieved than if a heat sink or cold plate was bonded or mated to the package. Additionally, thermal interface losses are reduced, further improving performance.

In this illustration, the PCB 360 includes a cutout, such that the underside of the packaged heat generating device 350 is accessible. The modular microjet cooler 300 is then affixed to one surface of the packaged heat generating device 350. The modular microjet cooler 300 may be attached to any impervious surface of the package, but would typically be affixed to the thermal pad surface of the package, if it exists, for greatest effect. In many embodiments, this may be the underside of the package. However, in other embodiments, the underside of the package may not be accessible. In these embodiments, the modular microjet cooler 300 may be affixed to the top surface of the package.

FIG. 3 shows crosshatched flow lines 301 that represent the supply fluid as it travels toward and impinges on the packaged heat generating device 350. The crosshatched flow lines 302 represent the exhaust fluid, which is then removed from the modular microjet cooler 300. As can be seen in FIG. 3, the microjets are submerged, indicating that the supply fluid exits into a region that contains exhaust fluid and is confined by geometry.

FIG. 3 is intended to illustrate that the modular microjet cooler 300 may be affixed to a packaged heat generating device 350. There are a variety of methods that can be used to accomplish this connection. Of particular note, the material of the modular microjet cooler and the method of attachment do not participate significantly in the thermal performance. This allows great flexibility in the choice of materials, avoiding the need for expensive coatings or high conductivity deposited layers.

Figure 4A:
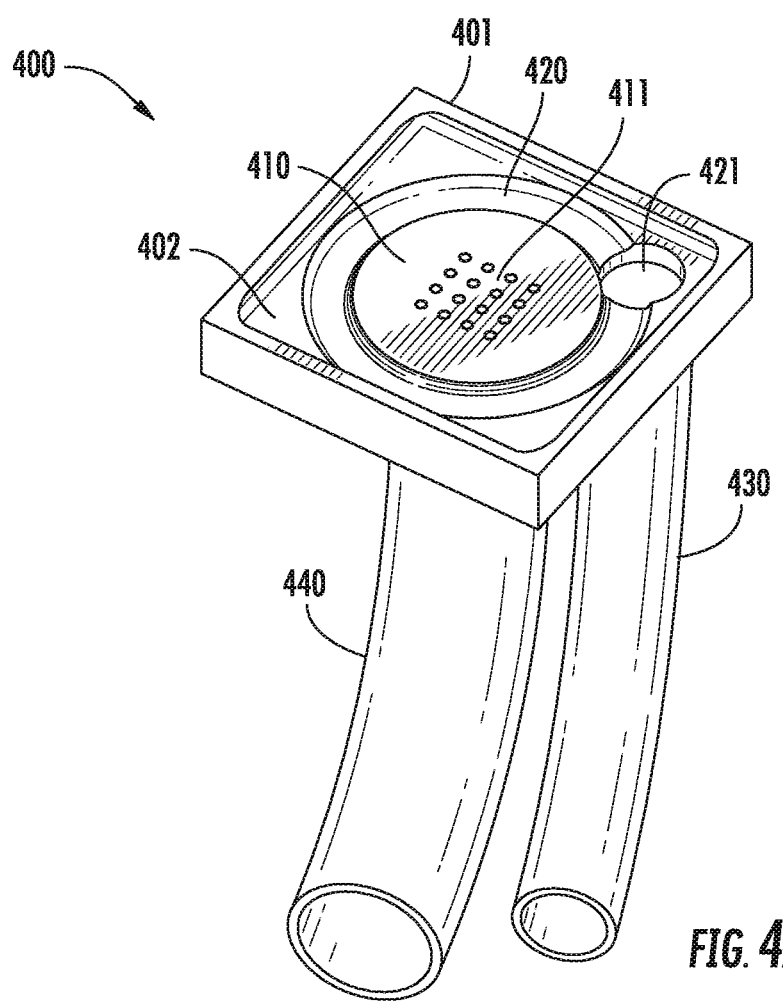
FIGS. 4A-4B show a top view and a cross-sectional view, respectively, of the modular microjet cooler, according to one embodiment.
Figure 4B:
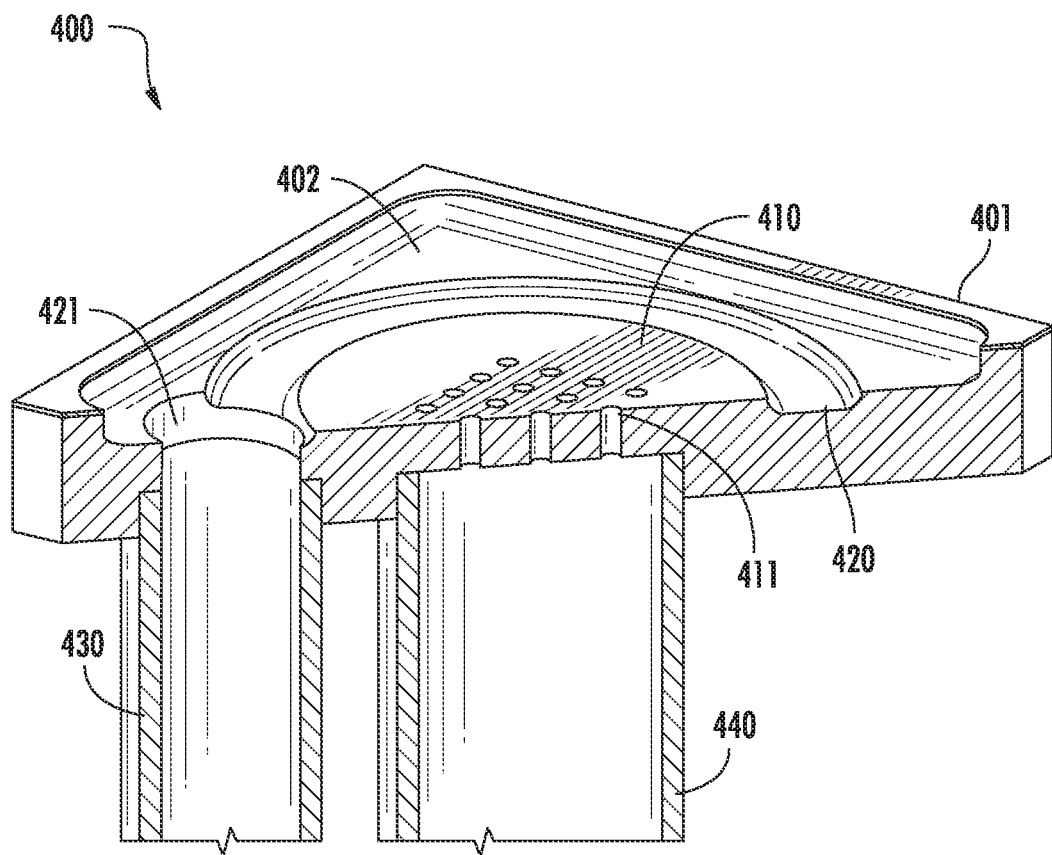

FIGS. 4A-B show a first embodiment, where FIG. 4A is a top view, and FIG. 4B is a cross-sectional view. The modular microjet cooler 400 comprises a plurality of raised sidewalls 401, which are connected to a base 402. The raised sidewalls 401 extend past the base 402, defining a cavity 403 (see FIG. 7). The cavity 403 is defined by the base 402 and the raised sidewalls 401 and has an open side. An adhesive, preform or solder may be disposed on the ends of the raised sidewalls 401 to allow a fluid-tight connection to the packaged heat generating device 350 on the PCB. The packaged heat generating device is attached proximate the open side of the cavity, and transforms the cavity 403 into a sealed region. The sealed region is defined by the base 402, the raised sidewalls 401 and the surface of the packaged heat generating device 350.

The base 402 comprises a center portion 410, which includes a plurality of microjet nozzles 411. On the outer surface of the base 402, the inlet tube 440 is attached. The inlet tube 440 may be attached to the modular microjet cooler 400 in a number of ways, and the attachment mechanism is not limited by this disclosure. The microjet nozzles 411 are in fluid communication with the inlet tube 440. For example, the base 402 may be formed to have internal passageways between the inlet tube 440 and the microjet nozzles 411.

While the center portion 410 is shown as being circular, other shapes are also possible. These microjet nozzles 411 may be arranged in a two dimensional matrix, as shown in FIG. 4A, or may be arranged in a different pattern. Further, although a matrix of 4×4 microjet nozzles is shown, the matrix may be any dimension and may not, in certain embodiments, be equal in the two dimensions. This arrangement of microjet nozzles 411 may be referred to as a microjet inlet array.

A trench 420 may surround the center portion 410. This trench 420 may extend into the base 402, and forms a channel to carry exhaust fluid to the exit port 421. The exit port 421 comprises one or more holes passing through the base 402, and provides an attachment mechanism for the outlet tube 430. The outlet tube 430 may be attached to the modular microjet cooler 400 in a number of ways, and the attachment mechanism is not limited by this disclosure.

Figure 5A:
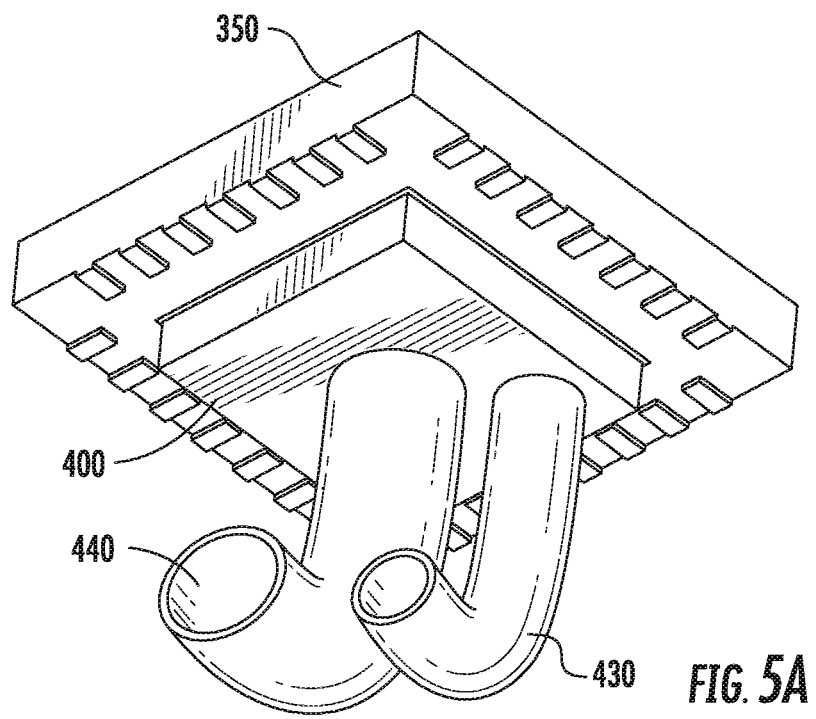
FIGS. 5A-5B show a bottom view and a cross-section view, respectively, of the modular microjet cooler of FIG. 4A attached to a packaged heat generating device.
Figure 5B:
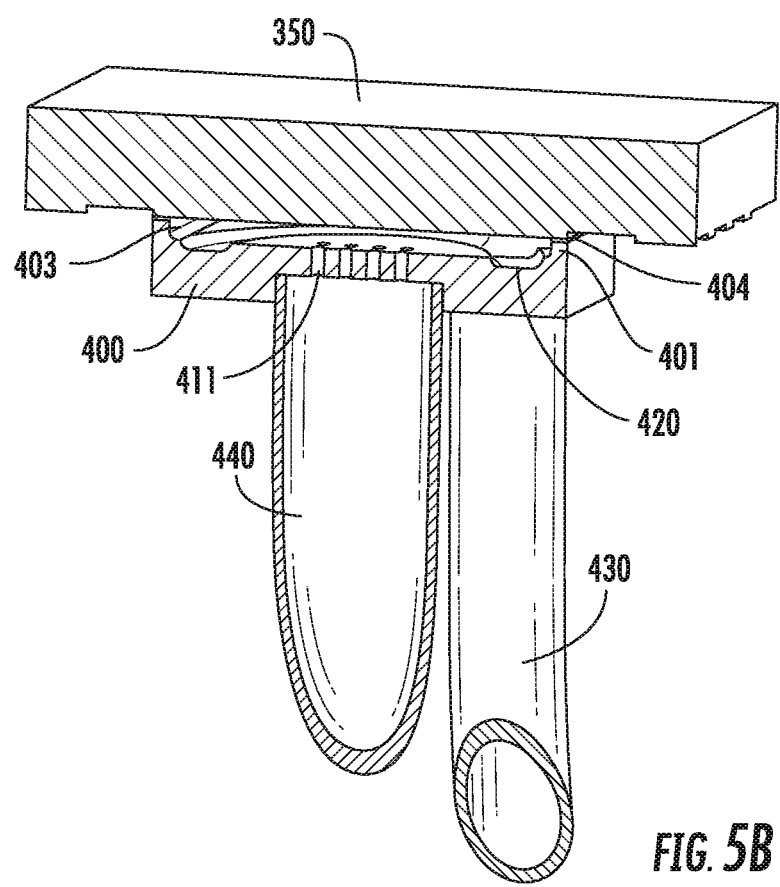

FIGS. 5A and 5B show the modular microjet cooler 400 attached to a packaged heat generating device 350. An attachment mechanism 404 may be used to attach the modular microjet cooler 400 to the packaged heat generating device 350. The attachment mechanism 404 may be an adhesive, solder, gaskets or clamping force. For example, this attachment mechanism 404 could be a solder (gold-tin, indium, etc) or an adhesive (epoxy, RTV, etc). FIG. 5A shows a bottom view, while FIG. 5B shows a cross-sectional view. While the inlet tube 440 and the outlet tube 430 are shown as being curved, the configuration of the tubes is not limited by this disclosure. Further, the relative sizes of the inlet tube 440 and the outlet tube 430 may differ from that shown in the figures.

Figure 6:
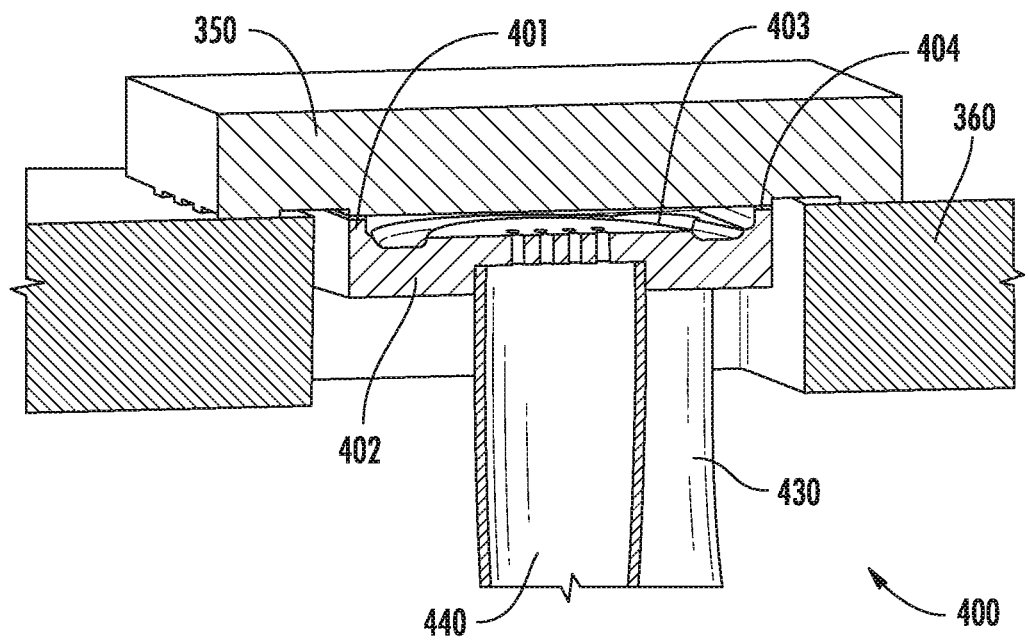
FIG. 6 shows a cross-sectional view of the modular microjet cooler of FIG. 4A attached to a packaged heat generating device mounted to a printed circuit board.

FIG. 6 shows the modular microjet cooler 400 attached to a packaged heat generating device 350 which is mounted to a PCB 360.

Figure 7:
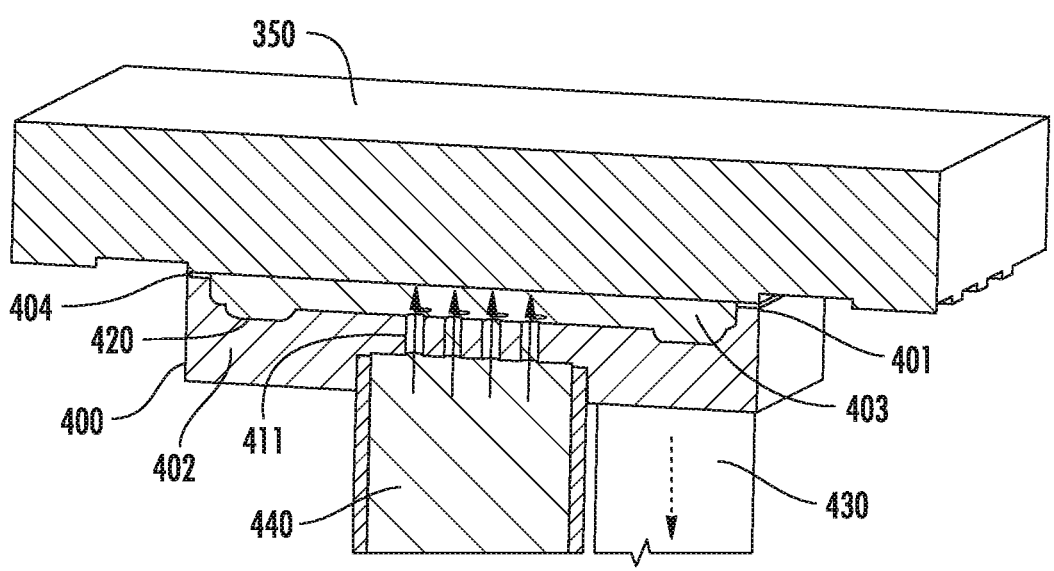
FIG. 7 shows the fluid flow in the modular microjet cooler of FIG. 4A.

FIG. 7 shows the modular microjet cooler 400 in use. Fluid enters the modular microjet cooler 400 through the inlet tube 440. The fluid passes through the microjet nozzles 411 and is directed toward the impingement surface of the packaged heat generating device 350. In other words, the microjet nozzles 411 are oriented so that fluid that passes through the microjet nozzles 411 is directed toward the open side of the cavity 403. The fluid fills the cavity 403. As described above, the cavity 403 is defined by the base 402 and the raised sidewalls 401 and has an open side. A sealed region is formed between the base 402 and the exterior surface of the packaged heat generating device 350 when the packaged heat generating device 350 is attached to the ends of the raised sidewalls 401. Exhaust fluid may enter the trench 420 and pass to the exit port 421 (see FIG. 4A). The exhaust fluid passes through the exit port 421 and exits via outlet tube 430. The modular microjet cooler 400 is attached to the packaged heat generating device 350 along the ends of the raised sidewalls 401 using the attachment mechanism 404. For example, an adhesive or epoxy, which may be temporary or permanent, may be disposed on the ends of the raised sidewalls 401, and the raised sidewalls 401 are pressed against the impingement surface of the packaged heat generating device 350. Thus, a fluid-tight seal is formed between the ends of the raised sidewalls 401 and the impingement surface of the packaged heat generating device 350.

While FIGS. 4A-4B show a particular configuration having a circular center portion with an array of microjet nozzles connected to an inlet tube, and a trench surrounding the center portion connected to an outlet tube, the disclosure is not limited to this embodiment. For example, there may be multiple inlet tubes and/or outlet tubes. Thus, in certain embodiments, there may be more than one exit port, each of which attaches to a respective outlet tube.

Figure 10A:
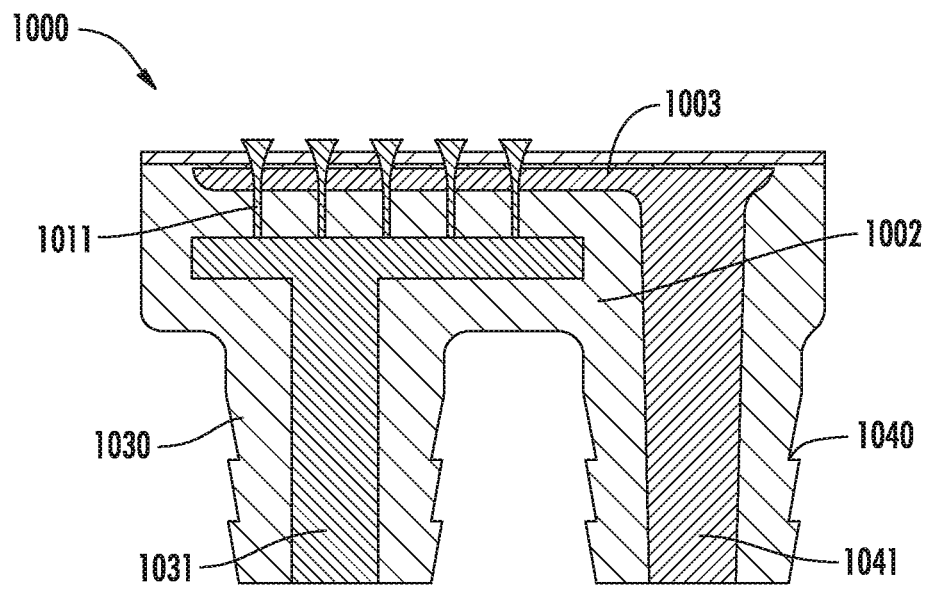
FIGS. 10A-10B show a cross-sectional view and a perspective view, respectively of the modular microjet cooler according to another embodiment.
Figure 10B:
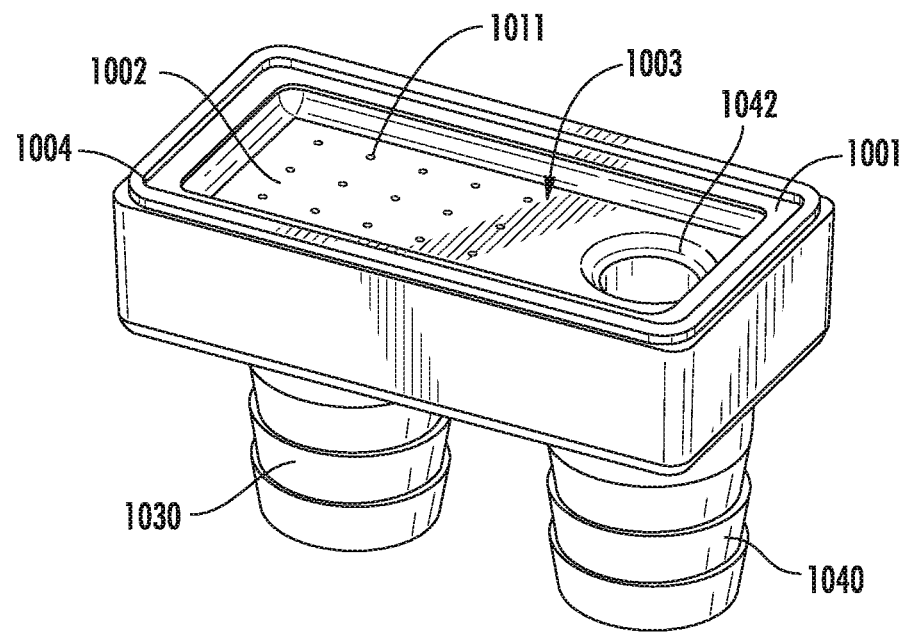

FIGS. 10A-10B show another embodiment of the modular microjet cooler 1000. FIG. 10A shows a cross-sectional view, while FIG. 10B shows a perspective view. In this embodiment, the modular microjet cooler 1000 comprises a base 1002 and raised sidewalls 1001, forming a cavity 1003. As described above, the modular microjet cooler 1000 may be attached to a packaged heat generating device by applying an attachment mechanism, such as an adhesive, solder, gaskets or clamping force, to attach the ends of the raised sidewalls 1001 to the package. This attachment mechanism 1004 could be a solder (gold-tin, indium, etc) or an adhesive (epoxy, RTV, etc). While it is shown as a preform, it could be any bonding agent that bonds the microjet module to a component.

As described above, the cavity 1003 has an open side. An inlet connector 1030 is disposed on a bottom surface of the base 1002. The inlet connector 1030 may be a barbed fitting that can be readily attached to a tube. The inlet connector 1030 comprises a passage 1031 to allow the flow of fluid into the base 1002. A plurality of microjet nozzles 1011 are in fluid communication with the passage 1031 in the inlet connector 1030 and terminate in the base 1002 facing the cavity 1003. The microjet nozzles 1011 are oriented such that the fluid flows toward the open side of the cavity 1003.

In this embodiment, an exhaust connector 1040 is also in communication with the base 1002. The exhaust connector 1040 may also be barbed to allow ready attachment of a tube. The exhaust connector 1040 has a passage 1041 in fluid communication with the cavity 1003. In other words, the passage 1041 terminates at the cavity 1003 with an exit port 1042 in the base 1002. In this embodiment, the cavity 1003 may be shaped like a rectangular prism. The microjet nozzles 1011 may be disposed on one portion of the base 1002 and the exit port 1042 may be disposed on a second portion of the base 1002, adjacent to the microjet nozzles 1011.

While FIGS. 10A-10B show barbed fittings for the inlet connector 1030 and the exhaust connector 1040, other fittings may be used. For example, the inlet connector 1030 and the exhaust connector 1040 may be quick disconnect fittings, of which there are many types and styles. These fittings are known to those skilled in the art.

The embodiment shown in FIGS. 10A-10B may be best suited for heat generating devices that are rectangular in shape. However, by modifying the dimensions, the embodiment may also accommodate square packages.

Figure 8A:
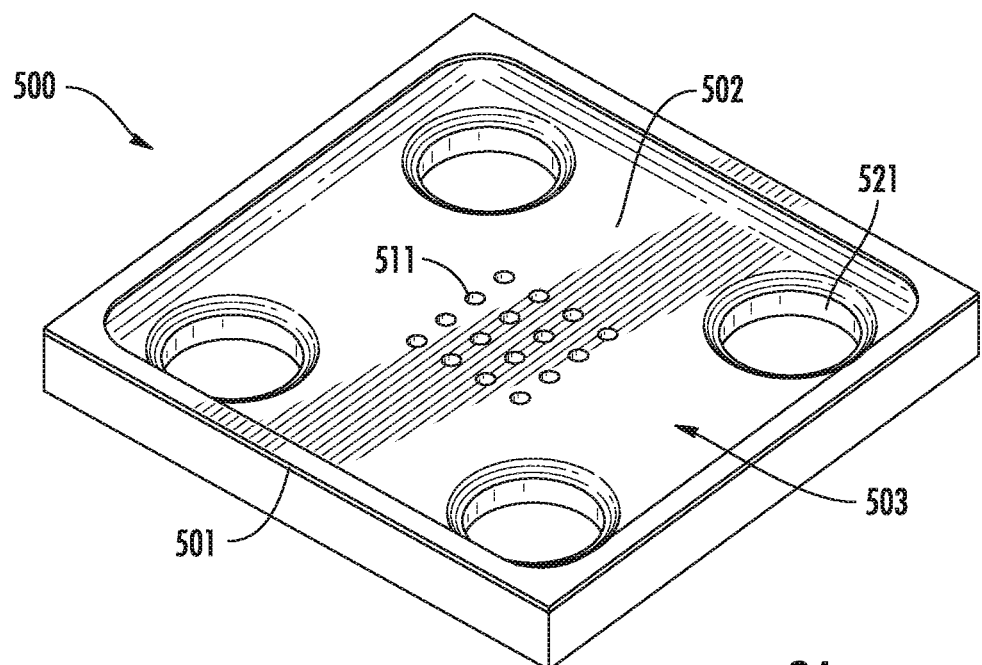
FIGS. 8A-8C show a top view, a bottom view and a cross-sectional view, respectively, of the modular microjet cooler, according to another embodiment.
Figure 8B:
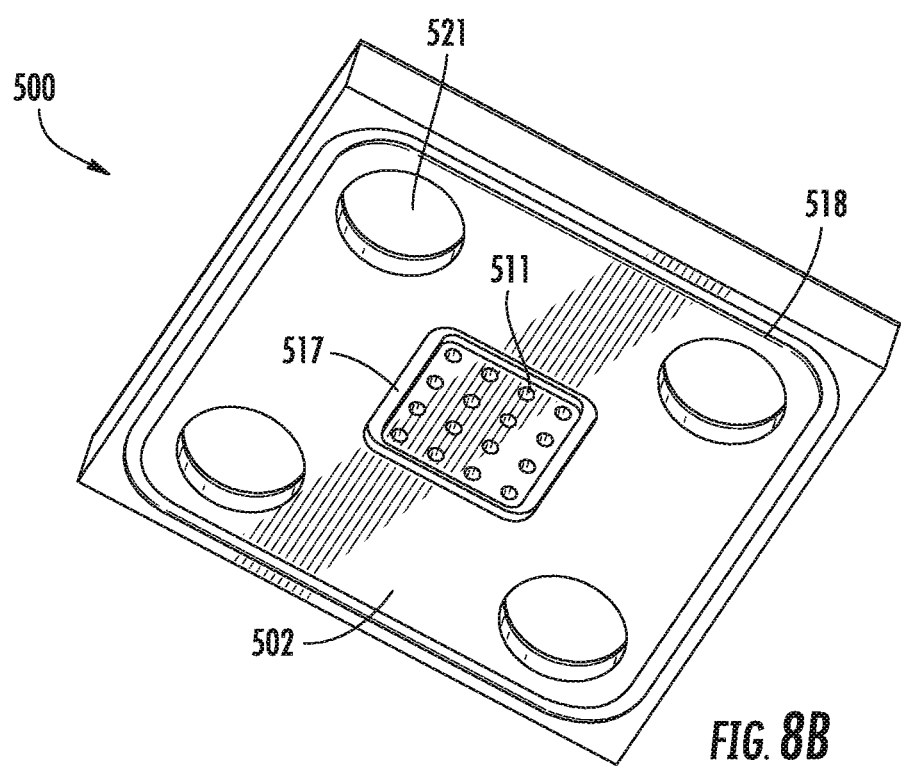
Figure 8C:
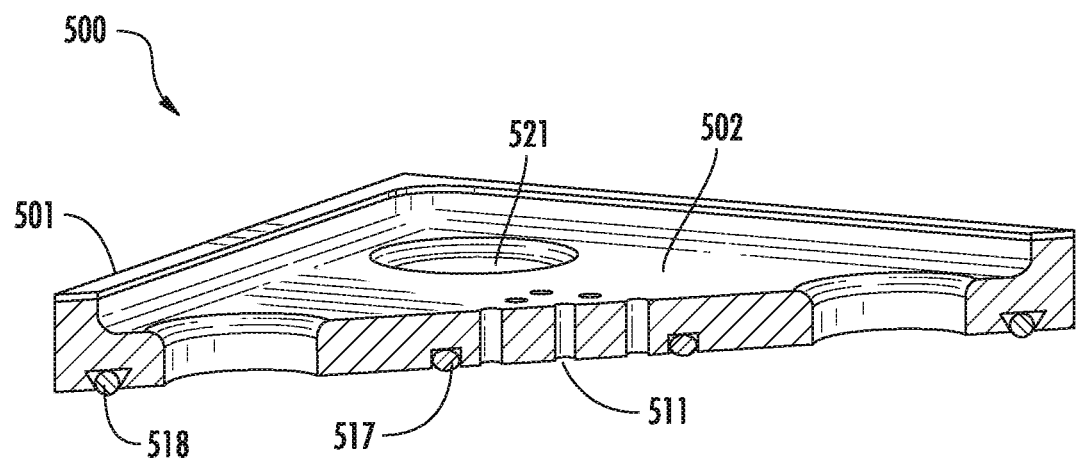

Further, there are embodiments which do not require the use of tubes. FIGS. 8A-8C show one such example. FIG. 8A shows a top view, FIG. 8B shows a bottom view and FIG. 8C shows a cross-sectional view. In this embodiment, the base 502 of the modular microjet cooler 500 comprises a plurality of microjet nozzles 511. These microjet nozzles 511 extend through an entirety of the base 502 and provide a passageway from the exterior bottom surface of the base 502 to the cavity 503. The microjet nozzles 511 serve as inlets for supply fluid. Exit ports 521 serve as outlets. In certain embodiments, the microjet nozzles 511 are disposed closer to the center of the base 502 than the exit ports 521. Sidewalls 501 surround the base 502 and extend upward from the base 502. The top surface of the sidewalls 501 is attached to an exterior surface of the packaged device using an attachment mechanism. This may be achieved using adhesive, solder, gaskets, or another mechanism. This attachment between the sidewalls 501 and the packaged device may be fluid-tight in certain embodiments.

On the exterior bottom surface of the base 502 opposite the cavity 503, as shown in FIG. 8B, a seal 517 may be disposed around the microjet nozzles 511. The seal 517 may be an O-ring in certain embodiments. Similarly, a second seal 518 may be disposed around the outer perimeter of the exit ports 521. In other embodiments, seals may be disposed about each individual opening, rather than around groups of openings, as shown in FIG. 8B.

Figure 9:
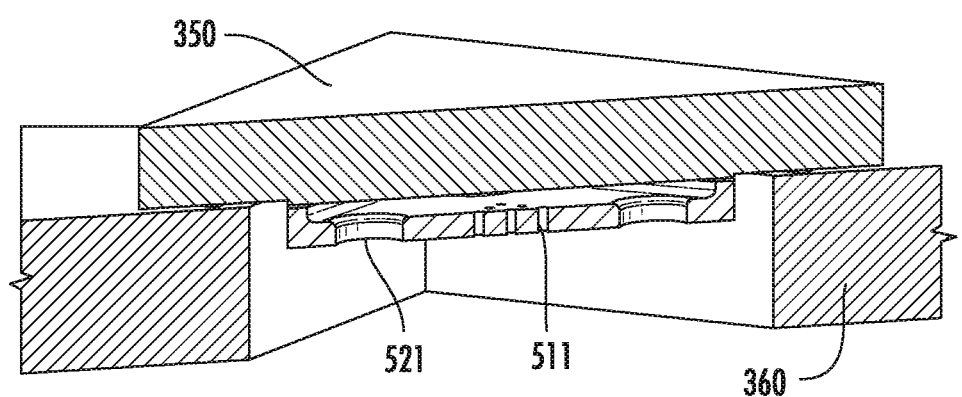
FIG. 9 shows the modular microjet cooler of FIG. 8A affixed to a packaged device, which is mounted to a printed circuit board.

FIG. 9 shows the modular microjet cooler 500 affixed to a packaged heat generating device 350, which is mounted on a printed circuit board 360. As described above, the modular microjet cooler 500 may be affixed to the packaged heat generating device 350 either before or after it is mounted to the printed circuit board 360. Each of these openings or groups of openings in the base 502 is aligned with a respective hole on an external manifold, shown in FIG. 11. This external manifold 600 provides supply fluid to the microjet nozzles 511 via outlet 610, and accepts exhaust fluid from the exit ports 521 via inlet 620. A fluid-tight connection may be made between the modular microjet cooler 500 and the external manifold 600 by applying sufficient pressure against the seals. As shown in FIG. 11, the external manifold 600 may have a modular microjet attachment 601 includes the outlet 610 and the inlet 620. Further, the external manifold 600 may comprise a plurality of these modular microjet attachments 601 to accommodate a plurality of heat generating devices disposed on a single PCB. Each modular microjet attachment 601 may be configured to mate with the seals 517, 518 on the exterior bottom surface of the base 502 of the modular microjet cooler 500, shown in FIG. 8B. The external manifold 600 also have a main inlet 630 and main outlet 640, which carry fluid to and from the modular microjet attachments 601 on the external manifold 600.

Thus, the present disclosure describes a modular microjet cooler that may be attached to a packaged heat generating device. In certain embodiments, tubes may connector directly to the base, as shown in FIGS. 4-7. In other embodiments, the base may include inlet and output connectors, which allow for attachment to tubing, as shown in FIGS. 10A-10B. In another embodiment, the modular microjet cooler may be attached to an external manifold, as shown in FIG. 9.

Further, the modular microjet cooler may be attached to the packaged heat generating device, either before or after the packaged heat generating device is attached to the PCB. In other words, in certain embodiments, the modular microjet cooler is attached to the packaged heat generating device prior to its assembly on the PCB. In other embodiments, the modular microjet cooler is attached to the packaged heat generating device after it has been assembled onto the PCB.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for cooling a packaged heat-generating device, comprising:

attaching a modular microjet cooler to a surface of the packaged heat-generating device, wherein the modular microjet cooler comprises an inlet, an outlet, and a base, wherein the outlet comprises an exit port and wherein the base comprises a center portion where a plurality of microjet nozzles are disposed, a trench surrounding the center portion, and a bottom surface that is opposite a surface that faces the packaged heat-generating device after connection to the packaged heat-generating device and wherein the exit port is disposed in the trench; and raised sidewalls extending from the base away from the bottom surface; wherein the surface of the packaged heat-generating device, the raised sidewalls and the bottom surface define a cavity, and wherein ends of the raised sidewalls attach to the surface of the packaged heat-generating device using an attachment mechanism disposed on the ends of the raised sidewalls;

introducing a single phase fluid to the modular microjet cooler through the inlet, such that microjets of the single phase fluid are created within the cavity;

impinging the surface of the packaged heat-generating device with the microjets; and exhausting the single phase fluid through the outlet.

2. The method of claim 1, wherein the attachment mechanism comprises solder, an adhesive or a gasket.

3. The method of claim 1, wherein the inlet and outlet each comprise connectors.

4. The method of claim 3, wherein the connectors are fittings.

5. The method of claim 1, wherein the inlet and outlet comprise tubes.

6. The method of claim 1, wherein a manifold supplies the single-phase fluid to the inlet and the outlet exhausts the single-phase fluid to the manifold.

7. The method of claim 1, wherein the packaged heat generating device is mounted to a printed circuit board.

* * * * *